United States Patent [19]

Agoston

[11] Patent Number: 4,701,714
[45] Date of Patent: Oct. 20, 1987

[54] TUNABLE DELAY LINE

[75] Inventor: Agoston Agoston, Beaverton, Oreg.

[73] Assignee: Tektronix, Inc., Beaverton, Oreg.

[21] Appl. No.: 846,320

[22] Filed: Mar. 31, 1986

[51] Int. Cl.[4] .................... H01C 1/082; H03K 3/26; H03K 5/13; H03H 7/18
[52] U.S. Cl. ..................................... 328/56; 307/320; 307/606; 333/138
[58] Field of Search ............... 307/590, 595, 597, 605, 307/606, 320; 328/55–57; 333/138, 139, 161, 164, 23

[56] References Cited

U.S. PATENT DOCUMENTS 3,068,405 12/1962 Glaser et al. ..................... 328/56
3,882,431 5/1975 Hopwood et al. ................ 307/320
3,983,416 9/1976 Gronson ........................... 328/56

Primary Examiner—Stanley D. Miller
Assistant Examiner—Trong Q. Phan
Attorney, Agent, or Firm—John P. Dellett

[57] ABSTRACT

A lumped-parameter, electrical delay line having shunt capacitance including variable-capacitance diodes. A tuning voltage applied to the diodes provides electrically variable delay at low jitter and stable insertion delay.

5 Claims, 3 Drawing Figures

TUNABLE DELAY LINE

BACKGROUND OF THE INVENTION

The invention relates to electrical delay line circuits, and particularly to such circuits having an electrically variable delay with low jitter and stable insertion delay.

A "delay line" is a circuit device utilized to lower the velocity of propagation of an electrical signal so that the time required for the signal to travel the length of the delay line is increased with respect to the signal traveling along a conventional signal transmission line. Electrical delay lines are generally classified into two types: distributed-parameter devices and lumped-parameter devices. "A lumped-parameter" delay line is constructed with a number of sections by connecting a set of inductances in series, and a capacitance connected from each junction to a common junction that corresponds with a second conductor in a conventional two-wire transmission line, each section producing a small amount of delay. Lumped-parameter delay lines have heretofore been constructed having only fixed delays. Although manually adjustable, variable capacitors have been provided for adjusting the impedance of each section in a lumped-parameter delay line, such adjustable elements are utilized only for minimizing signal reflection, and are not electrically variable, i.e., variable by an electrical control signal.

It is desirable to construct a delay line having a repeatable, electrically variable delay for use in generating delays in the range of nanoseconds. Variable delays in the nanosecond range have heretofore been generated with complex circuit devices by applying the sloping level of a fast ramp signal to one input of a comparator, for comparison with a staircase signal applied to another input thereof, variations of delay being determined by the level of the staircase signal. Several factors degrade repeatability and contribute to instability of the resultant delay. Drift, in the range of microvolts, in the level of the staircase signal, and offset of the comparator circuit affect the stability of insertion delay. Jitter, which is determined by noise at the input of the comparator, is appreciable. Further, delay stability decreases as component count increases, and the implementation of fast-ramp comparators requires a large number of component elements in a plurality of circuits, viz.: staircase and fastramp signal generator circuits, a comparator circuit, and timing-signal generator circuits.

In view of the foregoing, it is an object of the present invention to provide improved means for delaying an electrical signal.

Another object of the present invention is to provide an improved electrically tunable delay line.

It is another object of the present invention to provide a tunable delay line generating delays in the nanosecond range which are repeatable and stable.

SUMMARY OF THE INVENTION

In accordance with the present invention in a principal embodiment thereof, an electrical delay line is provided with lumped-parameter sections in cascade relation and having shunt capacitance in each section including a variable-capacitance diode. A variable tuning voltage applied to the diodes provides electrically variable delay of a signal input to the delay line with stable insertion delay and low jitter on the output signal.

DRAWINGS

While the invention is set forth with particularity in the appended claims, other objects, features, the organization and method of operation of the invention will become more apparent, and the invention will best be understood by referring to the following detailed description in conjunction with the accompanying drawing in which:

DESCRIPTION OF THE PREFERRED EMBODIMENT

Figure 1:
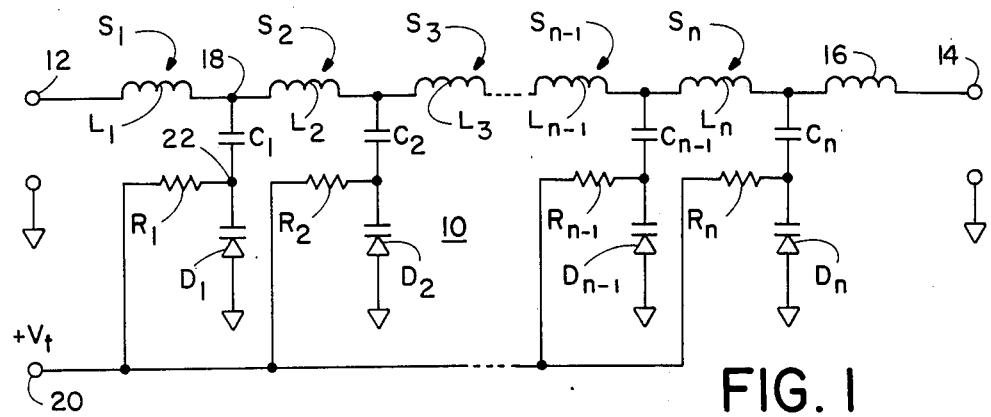
FIG. 1 is a schematic diagram of a tunable delay line in accordance with the present invention.

Referring now to the various views of the drawing for a more detailed description of the components, construction, operation and other features of the invention by characters of reference, FIG. 1 shows an electrical delay line 10 comprising a plurality of lumped-parameter sections $S_1$, $S_2$, $S_3$, ... $S_{n-1}$, $S_n$, where n is the number of sections, connected in cascade relation between a signal input terminal 12 and an output terminal 14 through an output inductor 16.

Each section of the delay line 10, as for example section $S_1$, includes an inductor $L_1$ connected between the input terminal 12 and a junction 18 intermediate inductors $L_1$, $L_2$ of contiguous delay line sections $Sl_1$, $S_2$. Shunt capacitance to ground comprises a capacitor C1 connected to the junction 18 and in series with a variable capacitance diode $D_1$ having its anode terminal connected to ground. A positive control or tuning voltage $V_t$ is applied from a terminal 20 through a resistor $R_1$ to a junction 22 intermediate the capacitor $C_1$ and the variable-capacitance diode $D_1$. $C_n$ is a coupling capacitor, and losses in each of the delay-line sections are determined primarily by the resistor $R_n$.

The delay line 10 is suitably constructed as a hybrid circuit device on a substrate of insulative material such as alumina, the inductors being deposited thereon as by screen printing, the capacitors and resistors being hybrid chip components. In the presently described embodiment of the invention, the delay line 10 includes seven sections $S_1$–$S_7$, the input inductor $L_1$ and the output inductor 16 each having an inductance of 20 nanohenries, while each of the intermediate inductors $L_2$–$L_7$ has an inductance of 40 nanohenries. The capacitors $C_1$–$C_7$ each have a capacitance of 100 picofarads, and the resistors $R_1$–$R_7$ are each 10 kiloohms. The variable capacitance diodes $D_1$–$D_7$ are type DK 6320A hybrid junction diodes manufactured by Alpha Industries, Inc.

Figure 2:
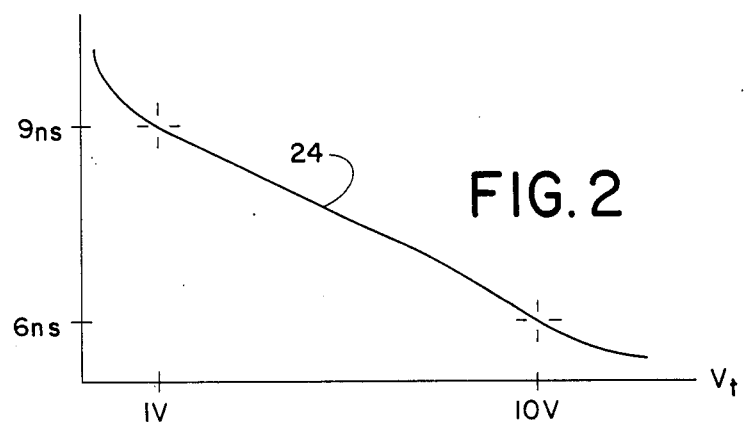
FIG. 2 is a curve representing the electrical characteristics of a delay line in accordance with the present invention.

Referring to FIG. 2, in the representative embodiment of the invention described herein, when the control voltage $V_t$ is varied between one and ten volts, the input signal, a step voltage, is delayed monotonically and relatively linearly between six and nine nanoseconds, as illustrated by the delay-line characteristic curve 24. Tuning sensitivity of the delay line was determined to be approximately 0.33 picoseconds per millivolt, with resolution less than 1 picosecond. The shape of the input step-voltage signal is virtually unchanged at the output of the delay line, the rise time varying less than 1.5 nanoseconds over the range of the control voltage The short-term stability of the delay line of the present invention is improved by one order of magnitude over the prior art delay generating circuits.

Figure 3:
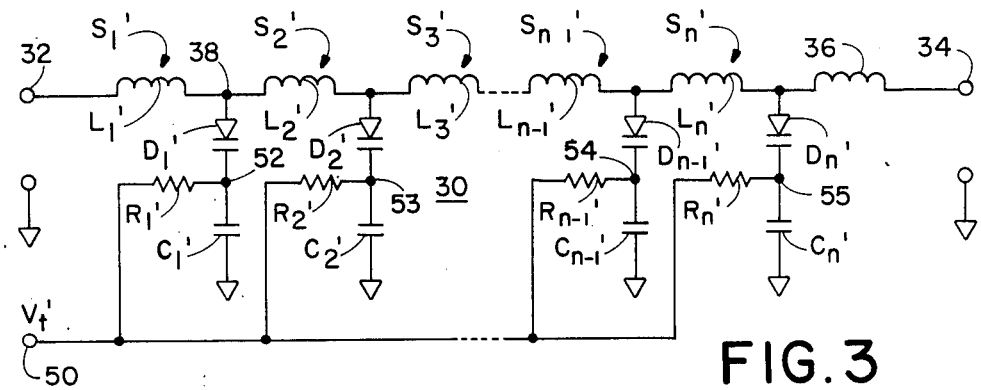
FIG. 3 is a schematic diagram of an alternative embodiment of a tunable delay line according to the present invention.

Referring to FIG. 3, an alternate embodiment of a tunable electrical delay line 30 in accordance with the instant invention comprises a plurality of lumped-parameter delay-line sections $S_1'$, $S_2'$, $S_3'$, ... $S_{n-1}'$, $S_n'$, where n is the number of sections, connected in cascade relation between a signal input terminal 32 and an output terminal 34 through an output inductor 36.

Each section of the delay line 30, as for example section $S_1'$, includes an inductor $L_1'$ connected between the input terminal 32 and a junction 38 intermediate inductors $L_1'$, $L_2'$ of contiguous delay line sections $S_1'$, $S_2'$. Shunt capacitance to ground comprises a variable capacitance diode $D_1'$ having its anode connected to the junction 38 and in series with a decoupling capacitor $C_1'$ connected to ground. A positive control or tuning voltage $V_t'$ is applied from a terminal 50 through a resistor $Rl_1'$ to a junction 52 intermediate the capacitor $C_1'$ and the variable-capacitance diode $D_1'$. $C_n'$ is a decoupling capacitor, and losses in the delay line 30 are determined primarily by the series resistance of the inductors $L_n'$. The control voltage input terminals 52-55 may conveniently be connected to a common control voltage source.

While the principles of the invention have now been made clear in the foregoing illustrative embodiments, there will be immediately obvious to those skilled in the art many modifications of structure, arrangement, proportions, the elements, material and components used in the practice of the invention, and otherwise, which are particularly adapted for specific environments and operating requirements without departing from those principles. The appended claims are, therefore, intended to cover and embrace any such modifications, within the limits only of the true spirit and scope of the invention.

I claim:

1. In a lumped-parameter electrical delay line having an input terminal receiving a signal to be delayed, an output terminal delivering the signal delayed, a first inductance and a second inductance connected in series between said input terminal and said output terminal, a shunt capacitance connected from a junction between said first and second inductances to a common terminal, wherein the improvement comprises: siad shunt capacitance including a variable capacitance diode, and control voltage means coupled to said variable capacitance diode for electrically varying the delay of said delay line.

2. A delay line, comprising:
a signal input terminal;
a first lumped-parameter section connected to said signal input terminal and receiving an input signal to be delayed;
a signal output terminal;
an output inductance connected to said signal output terminal;
a second lumped-parameter section in cascade relation with said first lumped-parameter section and delivering the input signal delayed through said output inductance to said output terminal, each of said lumped-parameter sections including
an inductance connected in series with the inductance of the other lumped-parameter section between said input terminal and said output inductance, and
a shunt capacitance connected from a junction intermediate said inductance to a common terminal, said shunt capacitance including a variable-capacitance diode; and
means for generating a variable control voltage, said variable control voltage being applied to said variable capacitance diodes, whereby variations in said variable control voltage vary the delay of said input signal traversing said delay line.

3. The delay line according to claim 2 wherein said shunt capacitance includes a capacitor connected to said inductance, said capacitor being in series with said variable-capacitance diode, said variable capacitance diode having an anode terminal connected to said common terminal and a capacitance terminal connected to said capacitor.

4. The delay line according to claim 3 further comprising a resistor connected to the capacitance terminal of each said variable-capacitance diode, said variable control voltage generating means being connected through said resistors.

5. The delay line according to claim 2 wherein each said shunt capacitance includes a capacitor connected in series with said variable-capacitance diode, said variable-capacitance diode including an anode terminal connected to said inductor and a capacitance terminal connected through said capacitor to said common terminal, and further comprising a resistor connected to the capacitance terminal of each said variable-capacitance diode, sid variable control voltage being connected through said resistors to said variable-capacitance diode.

* * * * *